(12) United States Patent
Shih

(10) Patent No.: US 6,888,161 B2
(45) Date of Patent: May 3, 2005

(54) STRUCTURE OF TFT PLANAR DISPLAY PANEL

(75) Inventor: An Shih, Changhua (TW)

(73) Assignee: Toppoly Optoelectronics Corp., Miao-Li (TW)

(*) Notice: Subject to any disclaimer, the term of this patent is extended or adjusted under 35 U.S.C. 154(b) by 0 days.

(21) Appl. No.: 10/321,306

(22) Filed: Dec. 17, 2002

(65) Prior Publication Data

US 2003/0230748 A1 Dec. 18, 2003

(30) Foreign Application Priority Data

May 29, 2002 (TW) ........................................ 91111422 A (51) Int. Cl.$^7$ ........................ H01L 29/04; H01L 31/036; H01L 31/0376; H01L 31/20
(52) U.S. Cl. ........................ 257/59; 257/66; 257/72; 257/347
(58) Field of Search ........................ 257/59, 66, 72, 257/347; 348/43, 44

(56) References Cited

U.S. PATENT DOCUMENTS

| 6,259,117 | B1 |   | 7/2001  | Takemura et al. |
| 6,285,041 | B1 |   | 9/2001  | Noguchi |
| 6,297,518 | B1 |   | 10/2001 | Zhang |
| 6,297,862 | B1 | * | 10/2001 | Murade ...................... 349/44 |
| 6,307,233 | B1 |   | 10/2001 | Awaka et al. |
| 6,740,938 | B2 | * | 5/2004  | Tsunoda et al. ............ 257/365 |

* cited by examiner

*Primary Examiner*—Thien F Tran
(74) *Attorney, Agent, or Firm*—Volpe and Koenig, P.C.

(57) ABSTRACT

A structure of a thin film transistor (TFT) planar display panel is disclosed. The structure includes a light-transmissible substrate, a buffer layer formed on the light-transmissible substrate, a top-gate TFT structure formed on the buffer layer and including a channel region, and a light-shielding structure formed between a back light source and the top-gate TFT structure, and substantially aligned with the channel region for protecting the channel region from illumination of the back light source. The process for manufacturing a TFT planar display panel is also disclosed.

16 Claims, 8 Drawing Sheets

Back light source

Back light source

STRUCTURE OF TFT PLANAR DISPLAY PANEL

FIELD OF THE INVENTION

The present invention relates to a structure of a planar display panel, and more particularly to a structure of a thin film transistor (TFT) planar display panel. The present invention also relates to a process for manufacturing a structure of a thin film transistor (TFT) planar display panel.

BACKGROUND OF THE INVENTION

Figure 1:
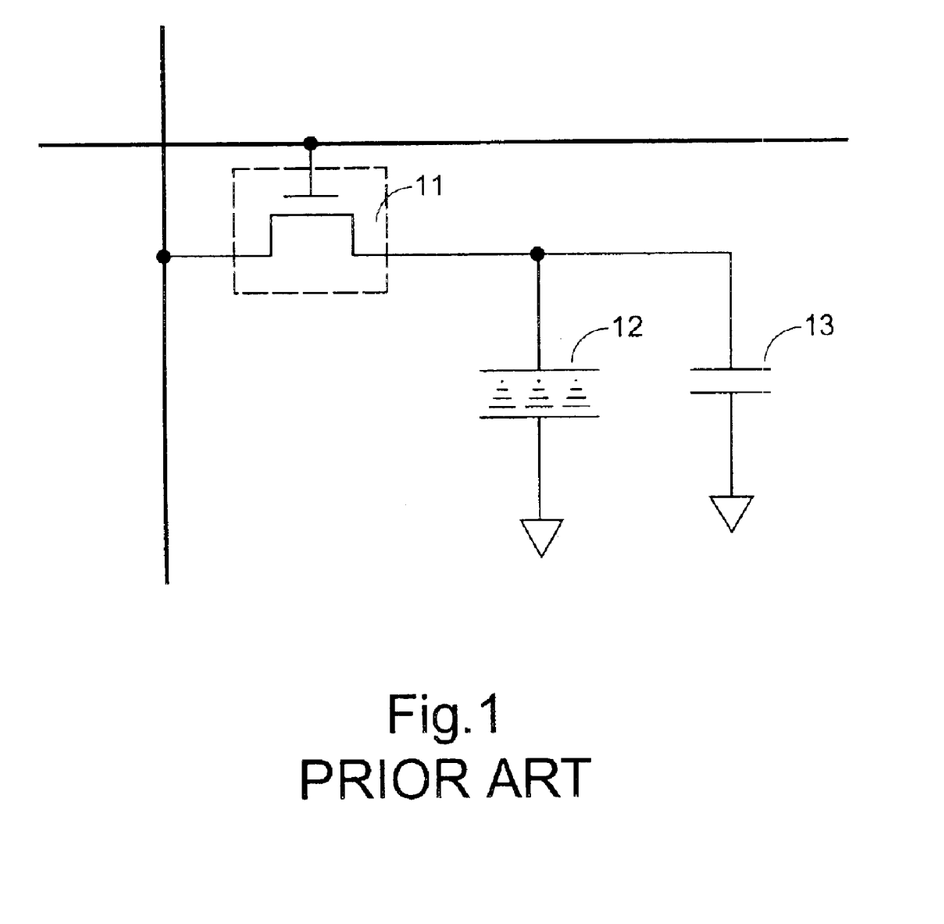
FIG. 1 is a schematic circuit diagram illustrating a pixel unit of a conventional thin film transistor liquid crystal display (TFT-LCD)

Due to the progress in manufacturing technology, liquid crystal displays (LCDs) are expected to take the place of conventional cathode-ray-tube (CRT) displays to become a leader in the display field in the near future. A thin film transistor (TFT) LCD is particularly popular among them. Please refer to FIG. 1 which is a schematic circuit diagram showing a pixel unit of a conventional TFT-LCD. The pixel unit includes a TFT switching unit 11, a liquid crystal displaying unit 12 and a storage capacitor 13. The storage capacitor 13 is connected to the liquid crystal displaying unit 12, which also functions as a capacitor, in parallel as a backup of the liquid crystal displaying unit 12 to store charges. Thus, the rapid voltage drop rate of the liquid crystal displaying unit 12 occurring when the TFT 11 turns off can be avoided.

Figure 2A:
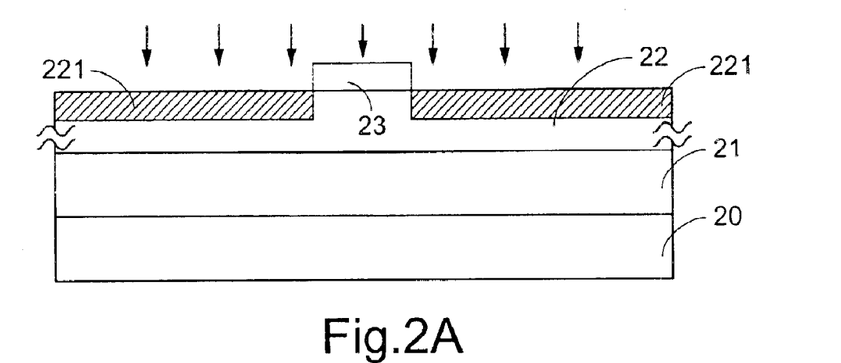
FIGS. 2A–2C are schematic cross-sectional diagrams illustrating the steps of a conventional process for producing a low temperature poly silicon thin film transistor (LTPS-TFT) of a TFT-LCD.
Figure 2B:
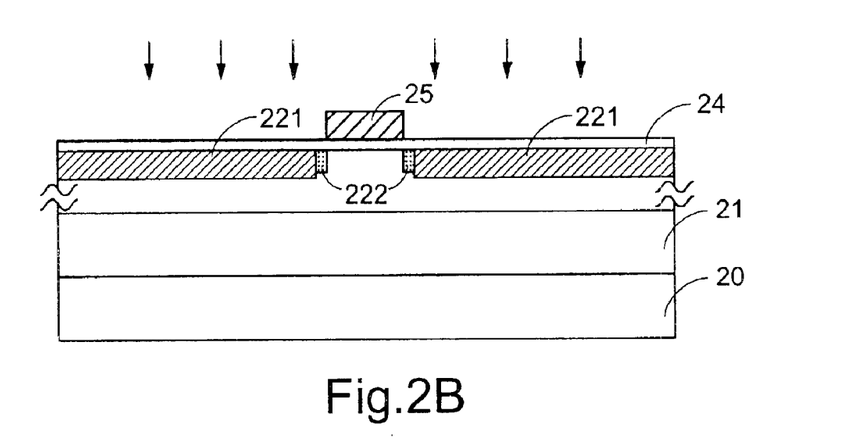
Figure 2C:
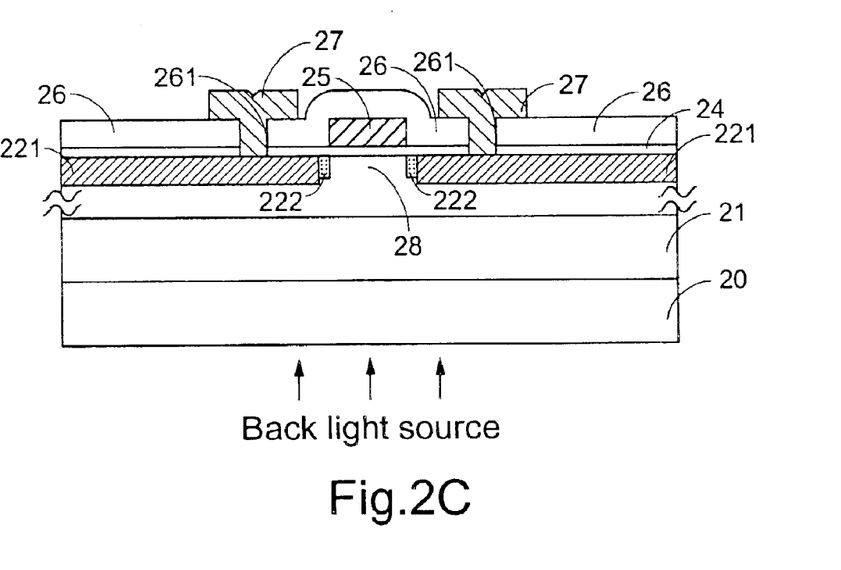

FIGS. 2A–2C are schematic cross-sectional diagrams illustrating the steps of a conventional process for producing a low temperature poly silicon thin film transistor (LTPS-TFT) of a TFT-LCD. Please refer to FIG. 2A. A buffer layer 21, for example made of silicon dioxide, is formed on a glass substrate 20. An intrinsic amorphous silicon (i-a-Si) layer is formed on the buffer layer 21, and then converted into an intrinsic polycrystalline silicon (i-poly-Si) layer 22 by a laser crystallization. A photoresist mask structure 23 is formed on the top of the i-poly-Si layer 22 by a masking and micro-photolithographic procedure. Subsequently, the portion of the i-poly-Si layer 22 exposed from the photoresist mask structure 23 is processed by an N-type implantation procedure with for example arsenic (As) or phosphorous (P) dopants to form source/drain regions 221 of an N-channel TFT.

Please refer to FIG. 2B. After the photo-mask 23 is removed, an insulating layer, for example made of silicon dioxide, is provided on the resulting substrate to form a gate insulator 24. Subsequently, a gate conductive layer is applied on the gate insulator 24 by sputtering, and a gate conductive structure 25 is formed by another masking and micro-photolithographic procedure. The gate conductive structure 25 is used as a mask in the following implantation procedure to provide trace N-type dopants in the i-poly-Si layer 22. Thus, lightly doped drain (LDD) regions 222 are formed with an N-channel 28 therebetween.

Afterwards, an interlayer dielectric 26 is applied onto the top of the resulting substrate, and contact holes 261 are defined at the proper positions. Then, a metal conductive layer is formed by sputtering, and fills the contact holes 261 to define a source/drain connecting line structure 27.

Since the LTPS-TFT has a modified TFT structure, that is, it is changed from a bottom gate structure to a top gate structure, the LTPS-TFT has better device properties. Unfortunately, such a top-gate LTPS-TFT structure has a disadvantage resulting from the exposed channel 28 under the back light. When the LTPS-TFT is in an OFF condition, significant photoelectric current will be generated in the channel area 28 due to the illumination of the back light source. In this situation, the current leakage of the device increases, and errors are likely to occur to adversely affect the gray-scale change of the liquid crystal and deteriorate the quality of the display.

Therefore, the purpose of the present invention is to develop a structure of a thin film transistor (TFT) planar display panel and a process for manufacturing the TFT planar display panel to deal with the above situations encountered in the prior art.

SUMMARY OF THE INVENTION

An object of the present invention is to provide a TFT-LCD panel structure and a process for producing the TFT-LCD panel structure for efficiently reducing the generation of the photoelectric current in the channel region of the top-gate TFT structure and avoiding the current leakage of the devices.

According to an aspect of the present invention, there is provided a structure of a thin film transistor (TFT) planar display panel. The structure includes a light-transmissible substrate, a buffer layer formed on the light-transmissible substrate, a top-gate TFT structure formed on the buffer layer and including a channel region, and a light-shielding structure formed between a back light source and the top-gate TFT structure, and substantially aligned with the channel region for protecting the channel region from illumination of the back light source.

For example, the light-transmissible substrate can be a glass substrate.

For example, the buffer layer can be formed of silicon nitride, silicon oxide, or a combination thereof.

In an embodiment, the light-shielding structure is formed between the back light source and the buffer layer.

In an alternative embodiment, the light-shielding structure is formed in the buffer layer.

Preferably, the light-shielding structure is formed of an opaque material having a relatively high melting point. For example, the light-shielding structure is formed of chromium (Cr), molybdenum (Mo), tungsten (W) or organic material.

Preferably, the top-gate TFT structure includes a semiconductor layer formed on the buffer layer and formed therein the channel region and source/drain regions, a gate insulating structure formed on the semiconductor layer, a gate conductive structure formed on the gate insulating structure above the channel region, a dielectric layer formed on the gate conductive structure and the gate insulating structure, and a conductive line structure formed on the dielectric layer and penetrating through the gate insulating structure and the dielectric layer to contact with the source/drain regions in the semiconductor layer.

Preferably, the structure further includes lightly doped drain regions disposed next to the source/drain regions and sandwiching therebetween the channel region.

For example, the semiconductor layer can be a polycrystalline silicon layer.

Preferably, the gate conductive structure is formed of chromium (Cr), tungsten molybdenum (WMo), tantalum (Ta), aluminum (Al) or copper (Cu).

For example, the gate insulating structure can be formed of silicon oxide.

Preferably, the structure further includes a black matrix which is implemented by the light-shielding structure.

For example, the top-gate TFT structure can be a low temperature polycrystalline silicon (LTPS) TFT structure.

According to another aspect of the present invention, there is provided a process for manufacturing a thin film transistor (TFT) planar display panel. The process includes steps of providing a light-transmissible substrate, forming a light-shielding structure on the light-transmissible substrate, and forming a first buffer layer and a top-gate TFT structure on the resulting substrate in sequence with a channel region of the top-gate TFT structure substantially aligned with the light-shielding structure.

Preferably, the light-shielding structure is formed by sputtering a light-shielding layer on the light-transmissible substrate, and defining and etching the light-shielding layer by a photolithographic process.

Preferably, the process further includes a step of forming a second buffering layer on the light-transmissible substrate prior to the formation of the light-shielding structure so as to dispose the light-shielding structure between the first and second buffering layers.

Preferably, the top-gate TFT structure is produced by steps of successively forming a semiconductor layer and a photoresist on the first buffer layer on a first side of the light-transmissible substrate, providing an exposing source from a second side of the light-transmissible substrate opposite to the first side with the light-shielding structure as a mask to define an exposed portion and a non-exposed portion of the photoresist, and then removing the exposed portion of the photoresist, using the unexposed portion of the photoresist as a mask to proceed a heavily doping ion implantation procedure on the semiconductor layer to form source/drain regions, successively forming a gate insulating layer and a first conductive layer on the semiconductor layer, and then performing a first masking and photolithographic procedure on the first conductive layer to form a gate conductive structure of the top-gate TFT structure, forming a dielectric layer on the gate insulating layer formed thereon the gate conductive structure, and then performing a second masking and photolithographic procedure on the gate insulating layer and the dielectric layer to form a contact hole, and forming a second conductive layer on the dielectric layer in connection with the source/drain regions through the contact hole, and performing a third masking and photolithographic procedure on the second conductive layer to form a source/drain connecting line structure.

Preferably, the top-gate TFT structure further includes lightly doped drain regions that are formed by using the gate conductive structure as a mask to proceed a lightly doping ion implantation procedure on the semiconductor layer.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention provides a TFT-LCD panel structure and a process for producing the TFT-LCD panel structure for solving the current-leakage problem resulting from the illumination of the back light source on the channel region. The TFT-LCD panel structure according to the present invention includes a light-shielding structure formed between the back light source and the top-gate TFT structure, and substantially aligned with the channel region for protecting the channel region from the illumination of the back light source. Thus, the current leakage problem of the devices occurring when the TFT is OFF will be efficiently reduced.

Figure 3A:
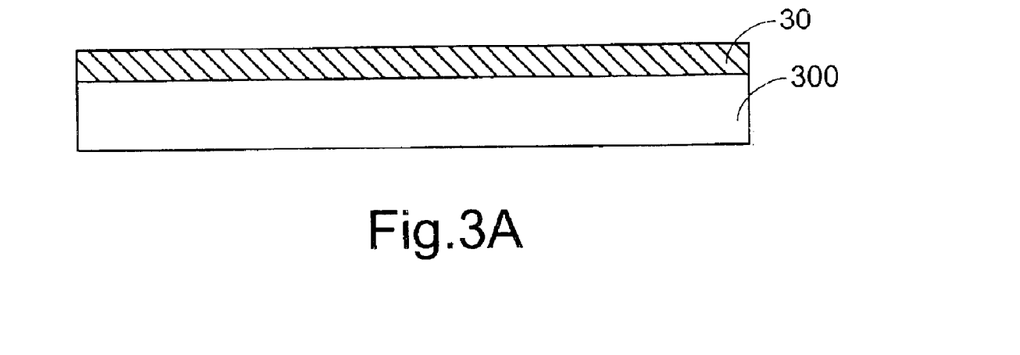
FIGS. 3A–3G are schematic cross-sectional diagrams illustrating a preferred embodiment of a process for producing a TFT-LCD panel according to the present invention.
Figure 3B:
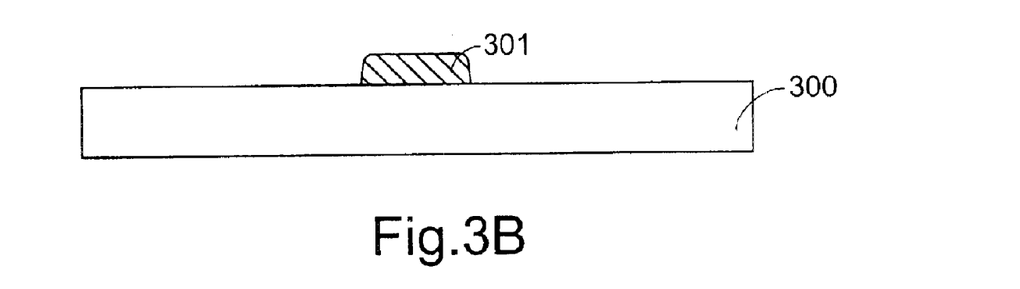
Figure 3C:
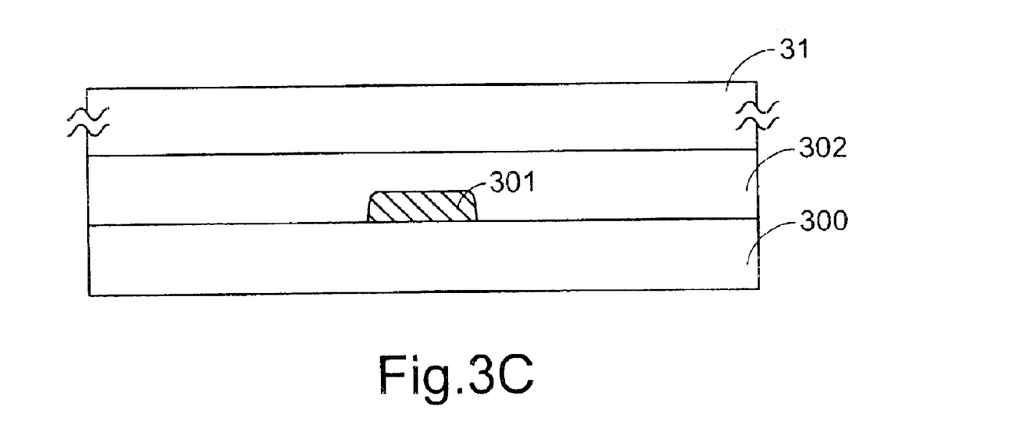
Figure 3D:
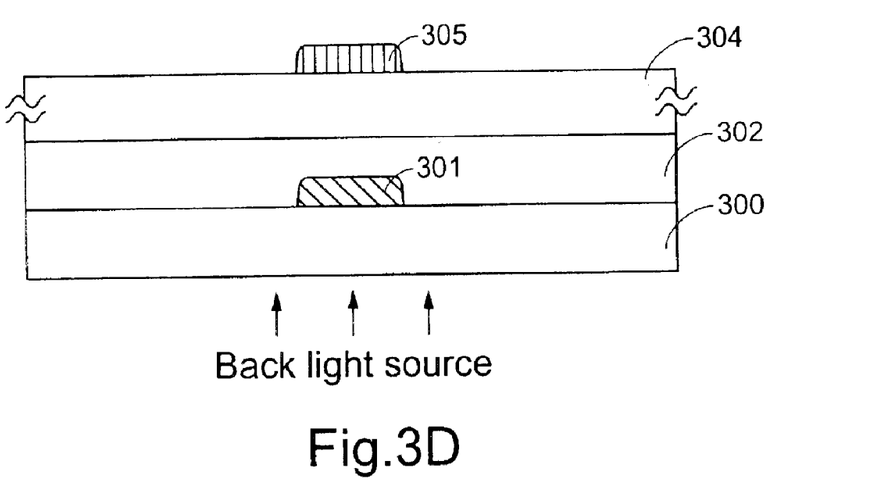
Figure 3E:
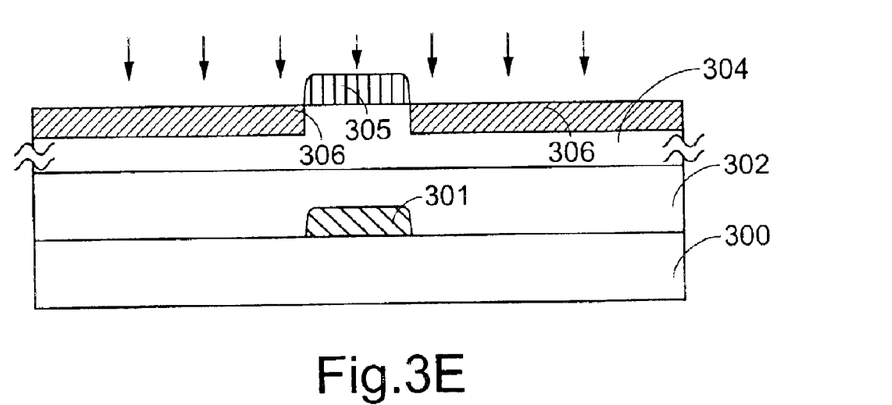
Figure 3F:
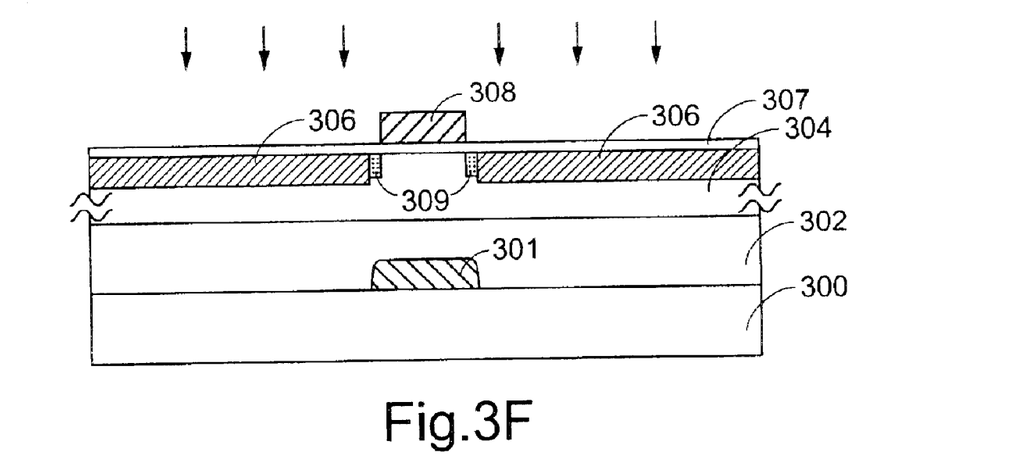
Figure 3G:
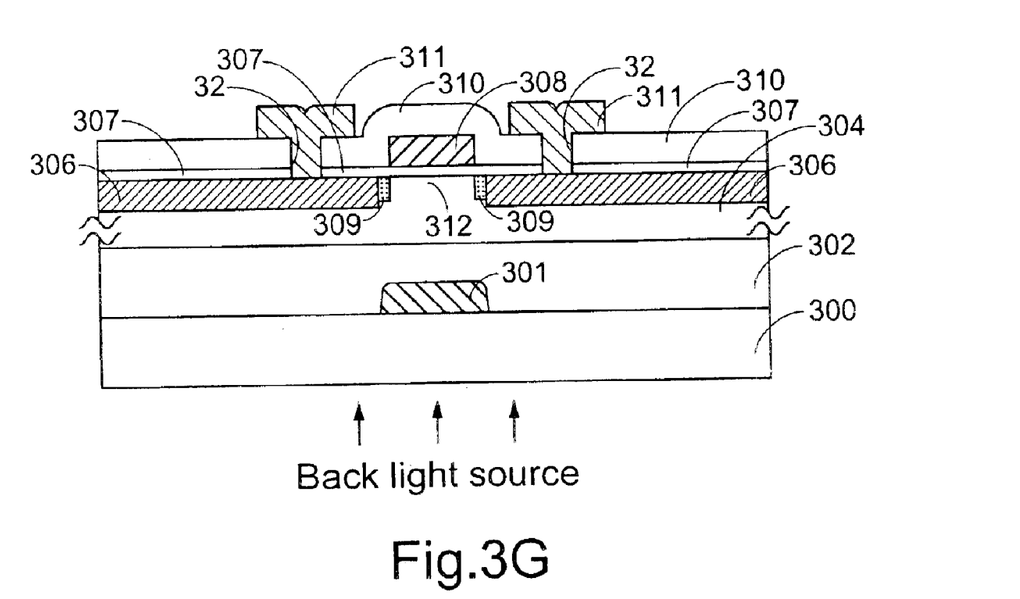

Please refer to FIGS. 3A–3G which are schematic cross-sectional diagrams illustrating the steps of a process for producing a TFT-LCD panel according to the present invention. First of all, as shown in FIG. 3A, a light-shielding layer 30 is formed on a light-transmissible substrate 300. Then, a light-shielding structure 301 is defined and etched by a masking and photolithographic process, as shown in FIG. 3B. Please now refer to FIG. 3C. A buffer layer 302 and an amorphous silicon (a-Si:H) layer 31 are successively formed on the resulting light-transmissible substrate 300 with the light-shielding layer 301. Then, the amorphous silicon layer 31 is converted into a polysilicon layer 304 by a laser crystallizing process. Please refer to FIG. 3D. A photoresist layer is formed on the polysilicon layer 304, and exposed by a back light source with the light-shielding structure 301 as a mask. The exposed portion of the photoresist is removed. The non-exposed portion of the photoresist forms a photoresist mask structure 305 as shown in FIG. 3D. Then, a heavily doping ion implantation procedure proceeds to form source/drain regions 306 in the polysilicon layer 304 by using the structure 305 as a mask, as shown in FIG. 3E. After removing the photoresist mask structure 305, a gate insulating layer 307 and a conductive layer are formed on the resulting structure in sequence, and the conductive layer is further defined and etched by a masking and photolithographic process to form a gate conductive structure 308 as shown in FIG. 3F. Then, lightly doped drain regions 309 are formed by a trace N-type dopant implantation procedure with the gate conductive structure 308 as a mask. Please refer to FIG. 3G. After an interlayer dielectric layer 310 is formed on the resulting structure of FIG. 3F, a further masking and photolithographic process is performed to define contact holes 32 at proper positions. Then, another conductive layer is formed on the interlayer dielectric layer 310 and fills with the contact holes 32, and is defined and etched to form a source/drain connecting line structure 311 by a masking and photolithographic process. Thus, a top-gate TFT structure including a channel region 312 is formed on the buffer layer 302 with the light-shielding structure 301 substantially aligned with the channel region 312 to protect the channel region 312 from illumination of the back light source.

Figure 4A:
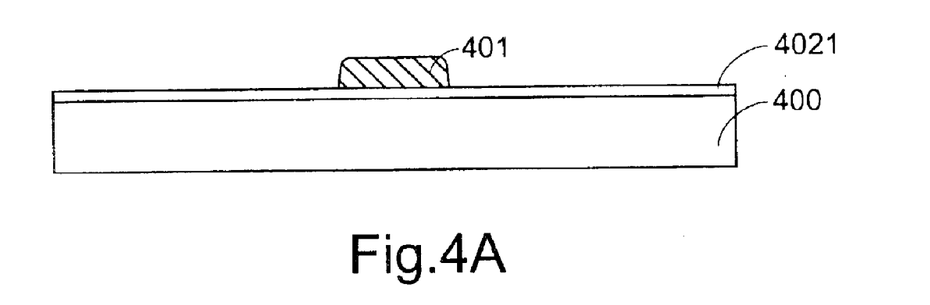
FIGS. 4A–4F are schematic cross-sectional diagrams illustrating another preferred embodiment of a process for producing a TFT-LCD panel according to the present invention.
Figure 4B:
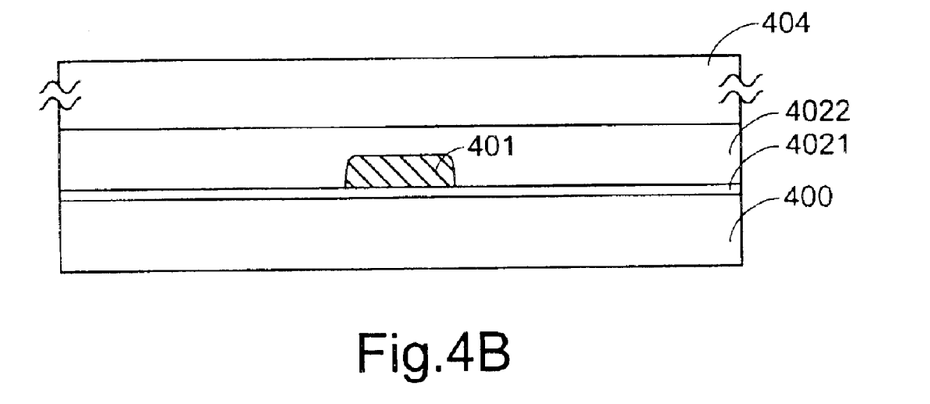
Figure 4C:
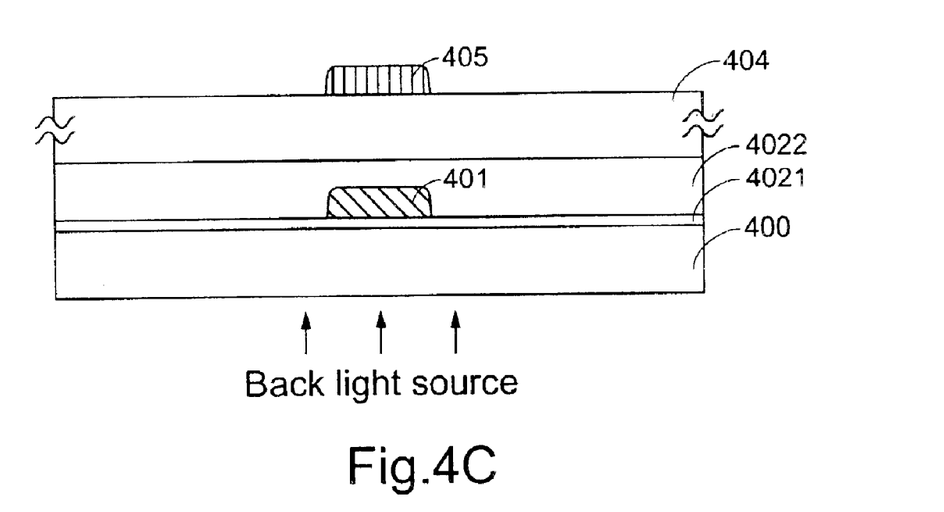
Figure 4D:
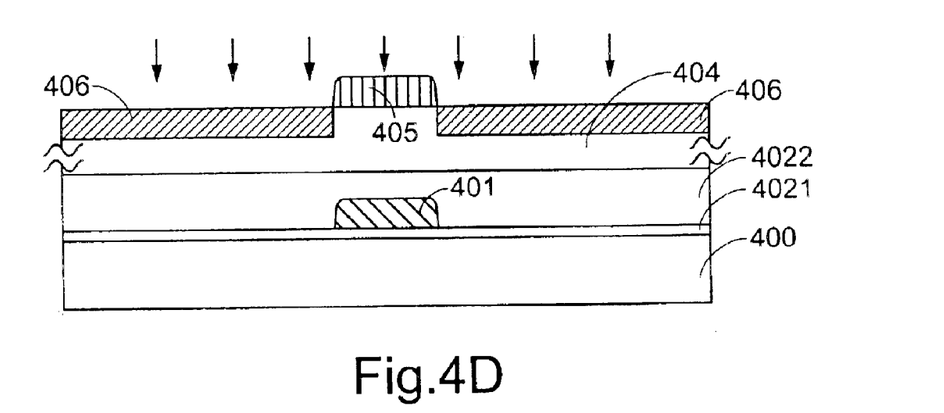
Figure 4E:
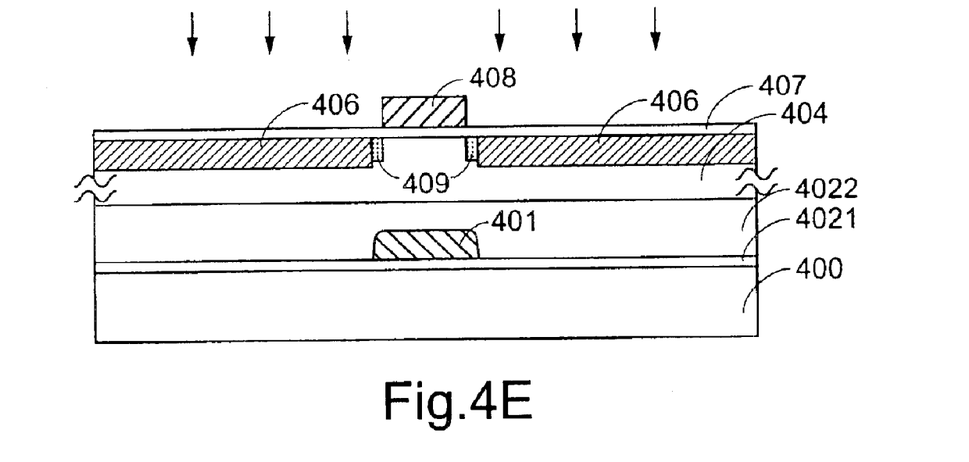
Figure 4F:
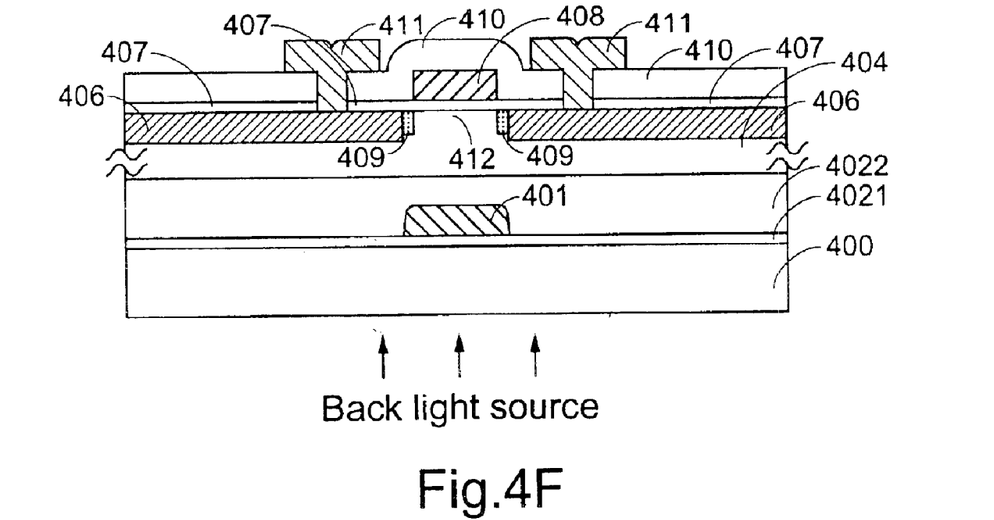

FIGS. 4A–4F are schematic cross-sectional diagrams illustrating the steps of another process for producing a TFT-LCD panel according to the present invention. A buffer layer 4021 and a light-shielding layer are formed on a light-transmissible substrate 400 in sequence. Subsequently, a masking and photolithographic process proceeds to define a light-shielding structure 401, as shown in FIG. 4A. Please refer to FIG. 4B. Another buffer layer 4022 and an amorphous silicon (a-Si:H) layer are successively formed on the buffer layer 4021 with the light-shielding structure 401. Then, the amorphous silicon layer is converted into a polysilicon layer 404 by a laser crystallizing process. It is understood that the material for forming the buffer layers 4021 and 4022 may be the same or different. The following steps for producing the top-gate TFT structure and the function of the light-shielding structure as shown in FIGS. 4C–4F are similar to those shown in FIGS. 3D–3G, so it would not be describe again herein. The numeral references 405, 406, 407, 408, 409, 410, 411, 412 labeled in FIGS. 4C–4F indicate a photoresist mask structure, source/drain regions, a gate insulating layer, a gate conductive structure, LDD regions, a dielectric layer, a source/drain connecting line structure and a channel region, respectively.

In above embodiments, the light-transmissible substrate can be a light-transmissible glass. The conductive layer is formed of chromium (Cr), tungsten molybdenum (WMo), tantalum (Ta), aluminum (Al) or copper (Cu) by a sputtering procedure, and typically has thickness of around 200 nm. The buffer layer is formed of silicon nitride, silicon oxide or the combination thereof by plasma enhanced chemical vapor deposition (PECVD) and typically has thickness of around 600 nm. The light-shielding layer is formed of an opaque material having a relatively high melting point, e.g. chromium (Cr), molybdenum (Mo), or tungsten (W), by a sputtering procedure, and preferably has thickness of around 600 nm. The light-shielding layer can also be formed of organic material. The amorphous silicon layer is generally annealed and dehydrogenated for 30 minutes in a high temperature furnace before the laser crystallizing process, which performs 100 shots with the energy of 400 mJ/cm$^2$. The thickness of the amorphous silicon layer is typically around 50 nm. The heavily doping ion implantation procedure is performed with As or P ions as dopants under a dosage of around $1 \times 10^{15}$ cm$^{-2}$. The trace N-type dopant implantation procedure is performed under a dosage of around $1 \times 10^{13}$ cm$^{-2}$. The gate insulating layer is formed by plasma enhanced chemical vapor deposition (PECVD) and, generally, formed of silicon oxide, and typically has a thickness of around 100 nm.

In addition, the light-shielding structure according to the present invention is used not only for shielding the illumination of the back light source but also as a black matrix. Thus, no extra producing and aligning steps are required to provide a black matrix.

To sum up, the present invention provides a light-shielding structure, which is disposed upstream of the buffer layer in the light direction or incorporated into the buffer layer structure, to block the illumination of the back light source from adversely affecting the channel region. Therefore, the generation of the photoelectric current in the channel region can be efficiently controlled, and the current leakage problem can be avoided. In addition, since the back exposure technique is applied, a low temperature polycrystalline silicon (LTPS) TFT structure can be produced without increasing the masking numbers.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A structure of a thin film transistor (TFT) planar display panel comprising:
    a light-transmissible substrate;
    a buffer layer formed on said light-transmissible substrate;
    a top-gate TFT structure formed on said buffer layer and including a channel region; and
    a light-shielding structure formed between a back light source of said thin film transistor planar display panel and said top-gate TFT structure and electrically isolated from said top-gate TFT structure, and an area of said light-shielding structure being substantially aligned with and generally coextensive with said channel region for protecting said channel region from illumination of said back light source.

2. The structure according to claim 1 wherein said light-transmissible substrate is a glass substrate.

3. The structure according to claim 1 wherein said buffer layer is formed of a material selected from a group consisting of silicon nitride, silicon oxide, and a combination thereof.

4. The structure according to claim 1 wherein said light-shielding structure is formed between said back light source and said buffer layer.

5. The structure according to claim 1 wherein said light-shielding structure is formed in said buffer layer.

6. The structure according to claim 1 further comprises a black matrix which is implemented by said light-shielding structure.

7. The structure according to claim 1 wherein said top-gate TFT structure is a low temperature polycrystalline silicon (LTPS) TFT structure.

8. The structure according to claim 1 wherein said light-shielding structure is formed of an opaque material having a relatively high melting point.

9. The structure according to claim 8 wherein said light-shielding structure is formed of a material selected from a group consisting of chromium (Cr), molybdenum (Mo), tungsten (W) and organic material.

10. The structure according to claim 1 wherein said top-gate TFT structure includes:
    a semiconductor layer formed on said buffer layer and formed therein said channel region and source/drain regions;
    a gate insulating structure formed on said semiconductor layer;
    a gate conductive structure formed on said gate insulating structure above said channel region;
    a dielectric layer formed on said gate conductive structure and said gate insulating structure; and
    a conductive line structure formed on said dielectric layer and penetrating through said gate insulating structure and said dielectric layer to contact with said source/drain regions in said semiconductor layer.

11. The structure according to claim 10 further comprising lightly doped drain regions disposed next to said source/drain regions and sandwiching therebetween said channel region.

12. The structure according to claim 10 wherein said semiconductor layer is a polycrystalline silicon layer.

13. The structure according to claim 10 wherein said gate conductive structure is formed of a material selected from a group consisting of chromium (Cr), tungsten molybdenum (WMo), tantalum (Ta), aluminum (Al) and copper (Cu).

14. The structure according to claim 10 wherein said gate insulating structure is formed of silicon oxide.

15. A structure of a thin film transistor (TFT) planar display panel comprising:
- a light-transmissible substrate;
- a buffer layer formed on said light-transmissible substrate;
- a top-gate TFT structure formed on said buffer layer and including a channel region; and
- a light-shielding structure formed between a back light source of said thin film transistor planar display panel and said top-gate TFT structure and electrically isolated from said top-gate TFT structure, and serving as a mask while defining said channel region of said top-gate TFT structure so that an area of said light-shielding structure is substantially aligned with and generally coextensive with said channel region for protecting said channel region from illumination of said back light source.

16. A structure of a thin film transistor (TFT) planar display panel comprising:
- a light-transmissible substrate;
- a light-shielding structure formed on said light transmissible substrate;
- a buffer layer formed over said light-transmissible substrate;
- a top-gate TFT structure formed on said buffer layer and electrically isolated from said light-shielding structure, said top-gate TFT structure having a channel region defined by a patterned photoresist, wherein said photoresist is patterned in an exposing step using said light-shielding structure as a mask so that an area of said light-shielding structure is substantially aligned with and generally coextensive with said channel region for protecting said channel region from illumination of a back light source of said thin film transistor planar display panel.

* * * * *